United States Patent
Schmidt

(10) Patent No.: US 7,834,265 B2
(45) Date of Patent: Nov. 16, 2010

(54) PHOTOVOLTAIC INSULATING GLAZING

(75) Inventor: Christoph Schmidt, Gunzenhausen (DE)

(73) Assignee: Glaswerke Arnold GmbH & Co. KG, Remshalden (DE)

( * ) Notice: Subject to any disclaimer, the term of this patent is extended or adjusted under 35 U.S.C. 154(b) by 869 days.

(21) Appl. No.: 10/490,144

(22) PCT Filed: Sep. 20, 2002

(86) PCT No.: PCT/EP02/10620

§ 371 (c)(1),
(2), (4) Date: Sep. 24, 2004

(87) PCT Pub. No.: WO03/028114

PCT Pub. Date: Apr. 3, 2003

(65) Prior Publication Data

US 2005/0034754 A1 Feb. 17, 2005

(30) Foreign Application Priority Data

Sep. 21, 2001 (DE) ................. 101 46 498

(51) Int. Cl.
*H02N 6/00* (2006.01)
*H01L 25/04* (2006.01)
*H01L 31/04* (2006.01)
*H01J 5/02* (2006.01)
*H01L 31/00* (2006.01)
*E06B 3/24* (2006.01)

(52) U.S. Cl. ............... 136/251; 136/256; 136/259; 136/252; 428/34; 428/67; 428/1.5; 428/192; 206/0.82; 206/0.83; 206/0.84; 206/445; 206/486; 52/786.1; 52/171.3; 52/786.13

(58) Field of Classification Search ........... 136/248, 136/256, 251, 259, 252; 428/34, 67, 1.5, 428/192; 206/0.82, 0.83, 0.84, 445, 486; 52/786.1, 171.3, 786.13
See application file for complete search history.

(56) References Cited

U.S. PATENT DOCUMENTS

| | | | | | |
|---|---|---|---|---|---|
| 4,083,097 | A | * | 4/1978 | Anagnostou et al. | 438/67 |
| 4,097,308 | A | * | 6/1978 | Klein et al. | 136/251 |
| 4,167,644 | A | * | 9/1979 | Kurth et al. | 136/251 |
| 4,224,081 | A | * | 9/1980 | Kawamura et al. | 136/251 |
| 4,249,958 | A | * | 2/1981 | Baudin et al. | 136/251 |
| 4,401,839 | A | * | 8/1983 | Pyle | 136/251 |
| 4,582,953 | A | * | 4/1986 | Nagase et al. | 136/259 |

(Continued)

FOREIGN PATENT DOCUMENTS

CH 616203 A * 3/1980

(Continued)

OTHER PUBLICATIONS

Machine translation of DE19958879A1, Jul. 2001.*

*Primary Examiner*—Ula C Ruddock
*Assistant Examiner*—Golam Mowla
(74) *Attorney, Agent, or Firm*—Paul Vincent

(57) ABSTRACT

The invention relates to a photovoltaic insulating glazing comprising a multi-layer glazing with a photovoltaic module. The glazing is further characterized in that two contact strips for contacting the photovoltaic module are led out from an intermediate space between the glass layers and a spacer spaces the glass layers apart, thereby forming the intermediate space.

14 Claims, 2 Drawing Sheets

U.S. PATENT DOCUMENTS

| | | | |
|---|---|---|---|
| 4,607,132 A * | 8/1986 | Jarnagin | 136/248 |
| 4,832,755 A | 5/1989 | Barton | |
| 5,128,181 A * | 7/1992 | Kunert | 428/34 |
| 5,167,724 A * | 12/1992 | Chiang | 136/246 |
| 5,460,660 A * | 10/1995 | Albright et al. | 136/251 |
| 5,514,428 A * | 5/1996 | Kunert | 428/34 |
| 5,589,006 A * | 12/1996 | Itoyama et al. | 136/248 |
| 5,981,945 A * | 11/1999 | Spaeth et al. | 250/239 |
| 6,138,434 A * | 10/2000 | Demars et al. | 52/786.13 |
| 6,262,358 B1 * | 7/2001 | Kamimura et al. | 136/244 |
| 6,311,455 B1 * | 11/2001 | Gerard | 52/786.1 |
| 6,589,613 B1 * | 7/2003 | Kunert | 428/34 |
| 6,646,196 B2 * | 11/2003 | Fronek et al. | 136/251 |
| 2001/0026852 A1 * | 10/2001 | Poix et al. | 428/34 |
| 2003/0010378 A1 * | 1/2003 | Yoda et al. | 136/251 |
| 2003/0101664 A1 * | 6/2003 | Trpkovski | 52/171.3 |
| 2004/0067343 A1 * | 4/2004 | Beteille et al. | 428/192 |

FOREIGN PATENT DOCUMENTS

| | | |
|---|---|---|
| DE | 33 30 305 | 3/1985 |
| DE | 41 28 766 | 3/1993 |
| DE | 4227860 A1 * | 4/1993 |
| DE | 43 01 128 | 7/1994 |
| DE | 44 02 449 | 9/1994 |
| DE | 296 07 069 | 7/1996 |
| DE | 199 58 879 | 7/2001 |
| DE | 20302045 U1 * | 7/2003 |
| EP | 0 199 233 | 10/1986 |
| EP | 250691 A * | 1/1988 |
| FR | 2 423 621 | 11/1979 |
| GB | 2096682 A * | 10/1982 |
| GB | 2385086 A * | 8/2003 |

* cited by examiner

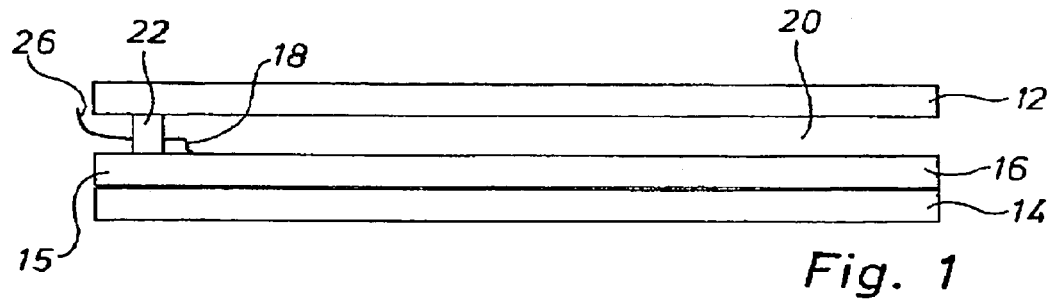
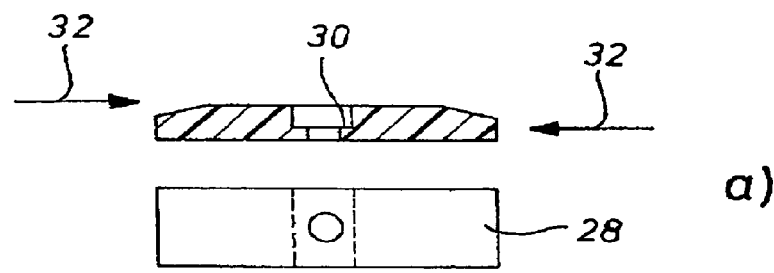
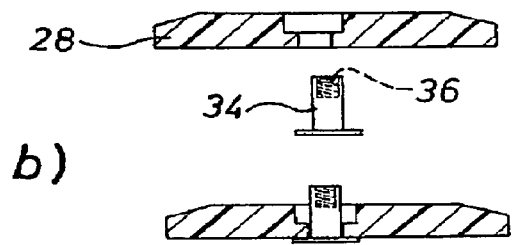
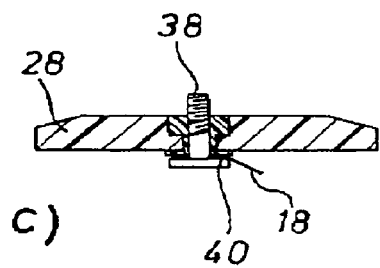
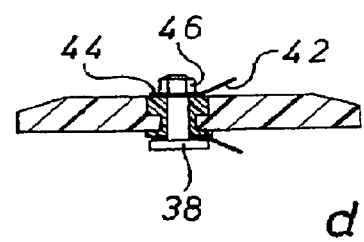
Fig. 2

PHOTOVOLTAIC INSULATING GLAZING

This application is the national stage of PCT/EP02/10620 filed on Sep. 20, 2002 and also claims Paris Convention priority of DE 101 46 498.3 filed on Sep. 21, 2001.

BACKGROUND OF THE INVENTION

The invention concerns a photovoltaic insulating glazing comprising a multi-layer glazing with a photovoltaic module, wherein contact strips contact the photovoltaic module and are led out from the photovoltaic module, and with a spacer, formed e.g. as a shaped bar, which spaces apart glass layers to form an intermediate space.

Photovoltaic modules are integrated into insulating glazing via a glass layer e.g. of a double glass structure, into or onto which the solar cells are embedded or disposed. The module generally constitutes one layer of the insulating glazing. The other layer is formed by a glass pane. An intermediate space is provided between the sheet of glass and the photovoltaic module which can be filled with gas to effect an insulating glazing. The invention also concerns other types of photovoltaic modules.

The production of photovoltaic insulating glazing requires an electric connection between the photovoltaic module of the insulating glazing and the outer side of the insulating glazing. In particular, processing of photovoltaic modules whose electric connections, the so-called "contact strips", exit the photovoltaic module through bores on the rear-side of the module cover causes problems, since this contact strip passes through the space between panes of the insulating glazing. The contact strips consist is a thin metal strip. The electric connection to external terminals must, in particular, meet the following requirements:

Gas and water vapor impermeability,
Tension relief of the module connections,
Small size on the rear side of a maximum of 5 mm corresponding to the usual sealing material cover of an insulating glazing,
Cable outlet should be tangential to the insulating glazing edge,
Optimum integration of assembly process in insulating glazing production.

Conventionally, a cable bushing is provided, wherein the connecting cables are soldered or crimped to the contact strips in the space between the panes of the insulating glazing and are then guided out of the pane region via bores in an insulating glazing spacer. The above-mentioned requirements are thereby not met or only to an insufficient extent.

It is therefore the underlying purpose of the present invention to provide a photovoltaic insulating glazing with which the electric connections are connected to the contact strips in a simple manner to satisfy the above-mentioned requirements.

SUMMARY OF THE INVENTION

This object is achieved in accordance with the invention by a photovoltaic insulating glazing having at least one opening in the spacer in which the contact strips and external connecting elements are fixed via a bolt which is inserted into the at least one opening, wherein the contact strips cooperate with electric connecting elements, in particular, an external connection cable, which are disposed outside of the glass layers.

The spacer may comprise, in particular, individual elements and connecting elements, wherein the individual elements are connected via the connecting elements, and the openings may be bores in the connecting elements. The connecting elements may be conventional linear or corner connections for insulating glazing spacers with bores to avoid additional production expense.

Alternatively, the spacer itself may have one or more bores. The bore may also simultaneously serve as a gas filling opening for the insulating glazing.

In particular, the bore may have a thread for screwing in the bolt. The bolt can also optionally be pressed into the bore.

In accordance with a first alternative, the contact strip may extend through the bore and be clamped via the bore thread. The contact strip is guided out of the bore on the other side where it is in direct contact with the electric connecting element. The electric connecting element may be e.g. a connecting cable with a cable lug, wherein the contact strip is directly connected to the cable lug. The bolt may e.g. have a nut or a bolt head by means of which the cable lug is clamped between the wall of the connecting element and/or the spacer and the bolt head, and is thereby held in a force-locking fashion to fix the external connecting element. The contact strip and the module connection itself are then tension-relieved and the opening in the spacer and/or connecting element is/are simultaneously closed to keep the gas, which is filled into the insulating glazing, confined within the space between the panes.

In accordance with a second alternative, the contact strip may also be connected to a cable lug and the cable lug is fixed below a corresponding bolt head such that the cable lug is clamped between the bolt head and the surface of the spacer and/or the connecting element, and electrically cooperates with the bolt, wherein the bolt projects to the outside through the bore and the electric connecting element is fixed to the bolt in a force-locking fashion using a nut (described above) and is also electrically connected to the bolt. In this case, the contact strip cooperates only indirectly with the electric connecting element, e.g. with an external cable.

Depending on the design, the bolts may be made from electrically conducting or non-conducting material of different embodiments, such as e.g. blind rivets, expansion bushings or the like.

In a further embodiment, an elastic sealing nipple may be provided in the bore to seal the space between the glass panes from the outer side of the glass layers. In this fashion, gas and vapor tightness is ensured to an even greater degree.

The connecting elements may be made from plastic material. The spacers which are formed e.g. of hollow aluminum members, are pushed onto and clamped on the connecting elements. In particular, press fitting may be provided. The electric connecting element may be a cable lug with fitted connecting cable.

If the spacers are made from electrically conducting material, non-conducting washers can be used to prevent electric contact between the bolt and the spacers, thereby preventing short-circuits.

If the openings are provided in the spacer itself and should the spacer be made from conducting material, electric insulation is always required. Hollow plastic shaped spacers require no insulation.

The contact strip can be guided out of the photovoltaic module through a bore in the rear module cover as well as laterally from the module layers. In this case, the spacer can be disposed either between the inner module cover and the glass pane or between the outer module cover and the glass pane.

If the spacer is disposed in accordance with the second alternative, the inner module cover must be shorter than the outer. The contact strip is fixed as described above.

If the spacer is disposed in accordance with the first alternative, the contact strip does not exit into the space between the panes, but completely outside of the insulating glazing. In this case, it is also fixed "from the outside" like those of the external connecting element, either through fixing via a cable lug or clamping between bore wall and bolt.

In a particularly preferred fashion, the bore in the spacer and/or connecting element does not penetrate through to the space between the panes, but only the outer side has an opening. The sealing of the space between the panes is thereby not impaired. In the finished pane, the contact strip is then finally also enclosed by the insulation.

In a particularly preferred fashion, the electric connection is no longer visible in the finished window or when the window is installed, since bores projecting into the space between the panes can be omitted.

In order to prevent the connecting cables, which penetrate at an angle outwardly through the sealing material of the insulating glazing, from being pulled out of the sealing material up to that location where the cable lug is mounted by the bolt on the spacer when the connecting cable is pulled, which would destroy the photovoltaic insulating glaze, a block, e.g. of plastic material can be provided at the cable outlet which has approximately the width of the insulating glass, i.e. a width corresponding approximately to the width of the glass panes enclosing the space between the panes, and the space between the panes itself. This block can be glued onto the non-hardened insulating glazing sealing material.

The block may be a conventional glazing block of a thickness of preferably 0.5 to 8 mm which may also serve as glazing block in addition to its function of protecting the cable outlet.

Such a block can also prevent crushing of the connecting cables between substructure and glass during installation.

A block of this type may comprise grooved recesses along the glass edge to receive the cable, which offer the additional advantage of increased sealing material coverage in the region of the electric connection. Moreover, the side of the block facing the glass may have projections in the form of e.g. barbs which press into the sealing material when the block is glued and which provide additional positive locking between block and sealing material after the sealing material has hardened.

The bores may be stepped bores.

BRIEF DESCRIPTION OF THE DRAWING

The invention is explained in more detail below with reference to embodiments.

FIG. 1 shows an inventive photovoltaic insulating glazing;

FIG. 2 shows assembly of the electric connection in accordance with a first embodiment;

DESCRIPTION OF THE PREFERRED EMBODIMENT

Figure 3:
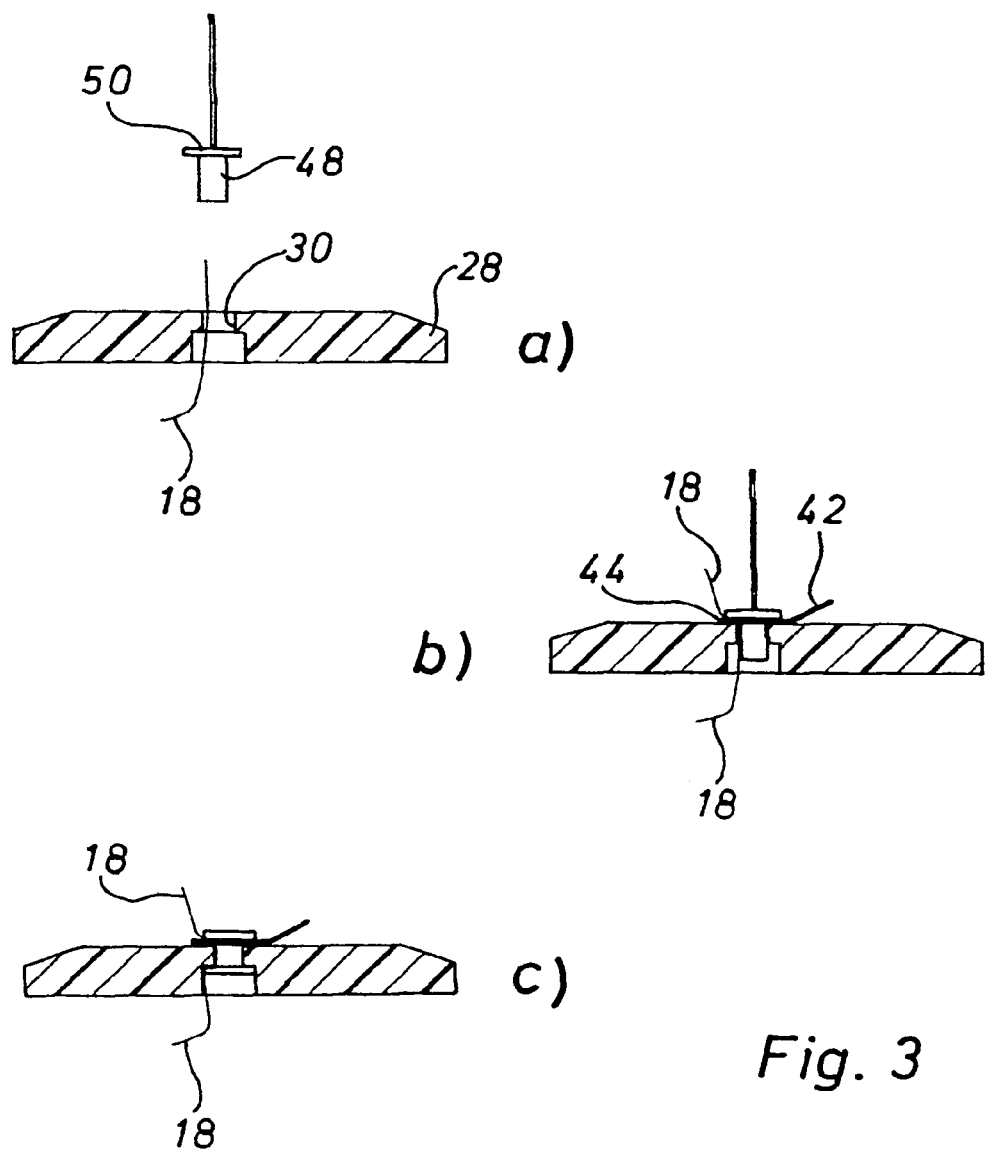
FIG. 3 shows a second embodiment of an electric connection.

FIG. 1 shows an insulating glazing which consists of two external glass panes 12 and 14. The pane 14 forms the outer cover of a photovoltaic module 16. The pane 15 forms the inner cover. Solar cells are disposed between the panes 14, 15.

The photovoltaic module 16 has a contact strip 18 to provide an electric connection. The contact strip 18 is thereby guided in the space 20 between the panes through a bore in the inner cover 15.

A conventional spacer 22 is provided to define a space 20 between the pane 15 and glass pane 12, which has an insulating function and by means of which the electric connection can be guided through the space 20 between the panes to the outside where it can contact an electric connecting element 26, in most cases an external cable. The space 20 between the panes is filled with gas, as is typical for insulating glazing. The electric connection must therefore be gas and vapor-tight.

The spacers 22 comprise of hollow aluminium, shaped elements which are held via connecting elements 28 of plastic material (shown in FIG. 2) by pushing a hollow aluminium element onto both sides of a connecting element 28, where it is frictionally held. The connecting elements 28 thereby have a bore 30.

To provide electric contact to the photovoltaic modules 16, the connecting element 28 may have a stepped bore 30, which is shown in FIG. 2a). FIG. 2a) shows a section of the corresponding connecting element 28 and its lower side. The hollow spacer elements 22 are pushed onto the connecting element 28 in the direction of arrow 32.

FIG. 2b) shows insertion of a special sealing nipple 34 of elastic material with integrated threaded nut 36 into the stepped bore 30. A threaded bolt 38 (shown in FIG. 2c) screws, with the integrated nut 36, the sealing nipple 34 to the shaft of the threaded bolt 38 and to the connecting element 28 in a gas-tight fashion.

During screwing, a conventional cable lug 40 is fixed to the threaded bolt 38 and provides electric contact to a contact strip 18 of the photovoltaic module 16. Such a connecting element 28 is installed in the insulating glazing spacer 22 using one connecting element 28 per contact strip 18.

For insulating glazing production itself, i.e. joining of the individual panes, the additional production step merely involves provision of the clamping connection between contact strip and cable lug. For sealing of the insulating glazing, the contact points are initially left open or provided with a suitable cover.

In the installed state (shown in FIG. 2d), the external connecting cable (electric connecting element 42) is also provided with a cable lug 44, and is fixed to the threaded bolt 36 using a threaded nut 46 to ensure gas-tight electric connection between the contact strips 18 and the electric connecting element 42 via the bolt 38.

Tensile forces on the electric connecting element 42 are introduced into the connecting element 28 and not into the contact strip 18 such that no tensile loads act on the latter. Gas and water vapor tightness is also ensured and the space 20 between the panes is independent of environmental influences.

After mounting of the external connecting cable, the connection is sealed with sealing material and thereby also electrically insulated.

Electrically non-conducting washers are moreover used below the cable lugs 44, 40 to prevent electric contact between bolt 38 and spacers 22 when the spacers 22, which may consist of a metallic material, are assembled with the connecting elements 28, to avoid possible short-circuits.

FIG. 3 shows three illustrations a) through c) of an alternative embodiment of the electric contact wherein the same parts have the same reference numerals.

The connecting element 28 has a bore 30 through which the contact strip 18 is guided. A blind rivet 48 serves as bolt, wherein a cable lug 44 is pushed under its head 50. The cable lug 44 is again connected to the electric connecting element 42. The blind rivet 48 is inserted into the bore 30 from the outside and mounted there (shown in FIGS. 3b and 3c).

The cable lug 44, which surrounds the blind rivet 48, is fixed under the head 50 of the blind rivet 48 and at the same time, the contact strip 18 is clamped between the wall of the bore 30 and the rivet 48. Transmission of tensile forces no longer acts on the contact strip 18. The contact strip 18 is directly contacted with the electric connection 42 and, as clearly shown in FIG. 3c), the bore is closed. The electric conductivity of the bolt or blind rivet is thereby not important.

In contrast to the alternative shown in FIG. 2, this solution has the advantage that mounting of the rivet 48 is possible after assembly of the insulating glazing. The bores 30 may at the same time serve as gas filling opening of the insulating glazing.

Alternatively, two bores may be provided in the structure of FIG. 1, wherein the contact strip 18 is led out of the space 20 between the panes via a first bore 30, wherein the bore 30 completely penetrates through the spacer 22 and is closed by a stopper when the contact strip 18 has been guided through, and a second bore is provided next to it which is formed in particular as a blind hole from the outer side of the spacer. The strip 18 can be fixed in this second bore (see FIG. 4) to facilitate contact.

Figure 4:
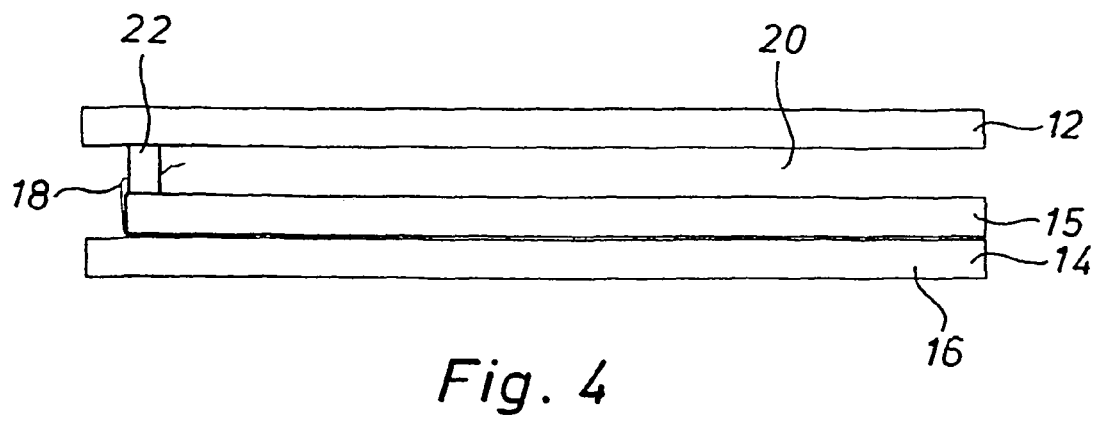
FIG. 4 shows a further embodiment of a PV insulating glazing.

FIG. 4 shows a variant, wherein the contact strip 18 is guided to the electric connection from the outside.

The spacer 22 is disposed between the inner module cover 15 and the glass pane 12. The cable strip exits between inner 15 and outer module cover 14 and is fixed "from the outside" in the spacer 22, analogously to the above-described fixing.

To ensure safe contact between contact strip 18 and cable lug 44, they can be soldered to each other. To prevent damage to the spacer 22, in particular if it is made from plastic material, soldering should be preferably carried out before mounting of the cable lug 44 and strip 18 to the bolt, which leads to the following preferred assembly steps:

- If required (FIG. 1), the strip 18 is guided through the bore 30 until it projects outwardly by a few centimeters;
- The strip 18 is soldered to the cable lug 44 of the electric connecting cable 26 at a separation of a few centimeters from the spacer 22;
- The cable lug 44 with soldered strip 18 is fixed with the bolt to the spacer 22.
- The projecting strip 18 is thereby pushed back into the bore or folded together and put on the back of the spacer 22.

Further advantages and features can be extracted from the remaining application documents. The features may be essential to the invention either individually or collectively.

I claim:

1. A photovoltaic insulating multi-layer glazing, for connection to an electrical element disposed external to the glazing, the glazing comprising:
    a photovoltaic module having a first pane, a second pane, and a photovoltaic element disposed between said first pane and said second pane;
    a third pane, said third pane consisting essentially of glass;
    a spacer disposed between said first pane of said photovoltaic module and said third pane to define a space between said first pane of said photovoltaic module and said third pane, said spacer structured to define a blind bore hole opening fashioned in said spacer on an outer side thereof;
    a contact strip in electrical communication with said photovoltaic element and fed sidewardly out of said photovoltaic module between said first pane and said second pane to contact the external electrical element; and
    a bolt cooperating with said contact strip and said blind bore hole to fix said contact strip in said blind bore hole from an outside direction, wherein neither said first pane nor said second pane has a through hole within which said contact strip passes from said photovoltaic element to said blind bore hole.

2. The photovoltaic insulating glazing of claim 1, wherein said spacer comprises several spacer elements and several connecting elements, wherein individual spacer elements are connected via said connecting elements and said opening is provided in at least one of said connecting elements.

3. The photovoltaic insulating glazing of claim 1, further comprising an elastic sealing nipple disposed in said opening for sealing said space between said module and said third pane from an outside of the glazing.

4. The photovoltaic insulating glazing of claim 3, wherein said elastic sealing nipple comprises a threaded nut.

5. The photovoltaic insulating glazing of claim 2, wherein at least one connecting element consists essentially of plastic material.

6. The photovoltaic insulating glazing of claim 2, wherein said spacer elements are pushed onto said connecting elements and are clamped thereon.

7. The photovoltaic insulating glazing of claim 2, wherein said connecting elements are linear connecting elements.

8. The photovoltaic insulating glazing of claim 2, wherein said connecting elements are corner connecting elements.

9. The photovoltaic insulating glazing of preceding claim 2, further comprising at least one cable lug for connection to at least one of the electrical element and said contact strip.

10. The photovoltaic insulating glazing of claim 2, wherein said spacer elements comprise electrically conducting, shaped elements.

11. The photovoltaic insulating glazing of claim 1, further comprising at least one non-conducting washer disposed to prevent electric contact between said bolt and said spacer.

12. The photovoltaic insulating glazing of claim 1, wherein said opening has a stepped bore.

13. The photovoltaic insulating of claim 1, wherein said opening has a thread and said bolt is a threaded bolt which is screwed into said opening thread.

14. The photovoltaic insulating glazing of claim 1, wherein said the bolt is a blind rivet.

* * * * *